(12) United States Patent
Iwasawa

(10) Patent No.: US 7,582,572 B2
(45) Date of Patent: Sep. 1, 2009

(54) METHOD OF MANUFACTURING INSULATING FILM, METHOD OF MANUFACTURING TRANSISTOR, AND METHOD OF MANUFACTURING ELECTRONIC DEVICE

(75) Inventor: Kazuaki Iwasawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 11/610,729

(22) Filed: Dec. 14, 2006

(65) Prior Publication Data
US 2007/0196966 A1    Aug. 23, 2007

(30) Foreign Application Priority Data
Dec. 15, 2005   (JP)   ............... P2005-362233

(51) Int. Cl.
*H01L 21/31*   (2006.01)
*H01L 21/469*   (2006.01)
(52) U.S. Cl. ............... 438/781; 438/790; 257/E21.576; 257/E21.498
(58) Field of Classification Search ............. 438/790, 438/792, 782, 798, 781; 427/98.3; 257/E21.576, 257/E21.498, E21.586, E21.497, E21.478
See application file for complete search history.

(56) References Cited

U.S. PATENT DOCUMENTS

| | | | | | |
|---|---|---|---|---|---|
| 5,932,283 | A | * | 8/1999 | Kaneyama | ............... 427/163.2 |
| 6,083,860 | A | * | 7/2000 | Matsuo et al. | ................ 501/92 |
| 2005/0153245 | A1 | * | 7/2005 | Sato et al. | .................... 430/313 |
| 2006/0003596 | A1 | * | 1/2006 | Fucsko et al. | ............... 438/758 |

FOREIGN PATENT DOCUMENTS

| | | |
|---|---|---|
| JP | 2001-319927 | 11/2001 |
| JP | 2002-367980 | 12/2002 |
| JP | 2004-241751 | 8/2004 |

* cited by examiner

*Primary Examiner*—Caridad M Everhart
(74) *Attorney, Agent, or Firm*—Oblon, Spivak, McClelland, Maier & Neustadt, P.C.

(57) ABSTRACT

A method of manufacturing an insulating film includes coating a first liquid material in which polysilazane is dissolved on a substrate; decreasing dangling bonds of silicon (Si) in the first liquid material; after decreasing the dangling bonds, coating a second liquid material which is similar to the first liquid material on the first liquid material; and converting the first liquid material and the second liquid material into a silicon (Si) insulating film.

12 Claims, 8 Drawing Sheets

FIG. 6

|    | BEFORE TREATMENT | AFTER TREATMENT |
|----|------------------|-----------------|
| O  | 14.27            | 60.74           |
| N  | 30.44            | 4.13            |
| Si | 55.28            | 35.12           |

FIG. 7

|    | BEFORE TREATMENT | AFTER TREATMENT |
|----|------------------|-----------------|
| O  | 0.26             | 1.73            |
| N  | 0.55             | 0.12            |
| Si | 1.00             | 1.00            |

METHOD OF MANUFACTURING INSULATING FILM, METHOD OF MANUFACTURING TRANSISTOR, AND METHOD OF MANUFACTURING ELECTRONIC DEVICE

CROSS REFERENCE TO RELATED APPLICATION

This application is based upon and claims the benefit of priority from the prior Japanese Patent Application No. 2005-362233 filed on Dec. 15, 2005, the entire contents of which is incorporated by reference.

BACKGROUND OF THE INVENTION

1. Field of the Invention

This invention relates to a method of manufacturing an insulating film, a method of manufacturing a transistor, and a method of manufacturing an electronic device, and more particularly relates to a method of manufacturing a spin-on-glass insulating film, a method of manufacturing a transistor in which a spin-on-glass insulating film is used as a gate insulating film, and a method of manufacturing an electronic device in which a spin-on-glass insulating film is buried within a trench.

2. Description of the Related Art

As a method of forming a silicon (Si) oxide film on a substrate such as a silicon substrate and a glass substrate, a physical vapor deposition (PVD) method, a chemical vapor deposition (CVD) method, a spin-on-glass method, or the like are known. In particular, with the spin-on-glass method which provides high versatility, silicon (Si) oxide films can be formed with lower costs, as described in Japanese Patent Laid-Open Publications Nos. 2001-319927, 2002-367980, and 2004-241751.

A polysilazane coated film which includes Si—N (nitrogen) bonding group, Si—H (hydrogen) bonding group, and N—H bonding group in the basic skeleton is used for the spin-on-glass method. The polysilazane coated film is a liquid material and is generally coated by spin coating. The polysilazane coated film which is spin-coated is subject to a heat treatment in a water-vapor ($H_2O$) atmosphere or an oxygen ($O_2$) atmosphere to convert the Si—N bonding group or the Si—H bonding group into the Si—O bonding group, so that a silicon (Si) oxide film can be formed.

While the above-described spin-on-glass method is advantageous in that the method provides high versatility and allows formation of an Si oxide film with low costs, the method has a problem that there the Si—N bonding group or the Si—H bonding group remain in the Si oxide film which is formed. Consequently, the Si oxide film which is formed by the spin-on-glass method has lower electrical characteristic, particularly lower withstand voltage and higher leakage current compared to that of a boron phosphorous silicate glass (BPSG) film or a tetra ethyl ortho-silicate (TEOS) film.

When a silicon (Si) oxide film formed by the spin-on-glass method is used as a gate insulating film of a thin film transistor (TFT) of a liquid crystal display device, for example, defects resulting from short circuit are generated due to poor dielectric strength between the gate electrode and the channel forming region (or the source region or the drain region). Further, as the leakage current increases in the thin film transistor, power consumption of the liquid crystal display device is increased.

BRIEF SUMMARY OF THE INVENTION

According to a first aspect of the embodiment of the invention, there is provided a method of manufacturing an insulating film. The method includes coating a first liquid material in which polysilazane is dissolved on a substrate; decreasing dangling bonds of silicon (Si) in the first liquid material; after decreasing the dangling bonds, coating a second liquid material which is similar to the first liquid material on the first liquid material; and converting the first liquid material and the second liquid material into a silicon (Si) insulating film.

In accordance with a second aspect of the embodiment, there is provided a method of manufacturing a transistor. The method includes coating a first liquid material in which polysilazane is dissolved over a surface of a first semiconductor thin film on a substrate; decreasing dangling bonds of silicon (Si) in the first liquid material; after decreasing the dangling bonds, coating a second liquid material which is similar to the first liquid material on the first liquid material; converting the first liquid material and the second liquid material into a silicon insulating film to form a gate insulating film; and forming a second semiconductor thin film or a metal film on the gate insulating film.

In accordance with a third aspect of the embodiment, there is provided a method of manufacturing an electronic device. The method includes forming a trench in a substrate in the depth direction from a surface of the substrate; coating a first liquid material in which polysilazane is dissolved on side surfaces and a bottom surface in the trench; decreasing dangling bonds of silicon (Si) in the first liquid material; after decreasing the dangling bonds, coating a second liquid material which is similar to the first liquid material on the first liquid material; and converting the first liquid material and the second liquid material into a silicon (Si) insulating film.

BRIEF DESCRIPTION OF THE SEVERAL VIEWS OF THE DRAWINGS

FIG. 6 is a chart showing numeral values of the surface element concentrations shown in FIG. 5;

FIG. 7 is a chart showing numeral values of the surface element concentrations with respect to the concentration of silicon in FIG. 5;

DETAILED DESCRIPTION OF THE INVENTION

Embodiments of the present invention will be described in detail with reference to the drawings.

FIRST EMBODIMENT

According to the first embodiment of the present invention, the present invention is applied to a method of manufacturing a liquid crystal display device (electronic device), and particularly a method of manufacturing a thin film transistor forming a liquid crystal display device and a gate insulating film of the thin film transistor.

[Method of Manufacturing a Liquid Crystal Display Device]

Figure 1:
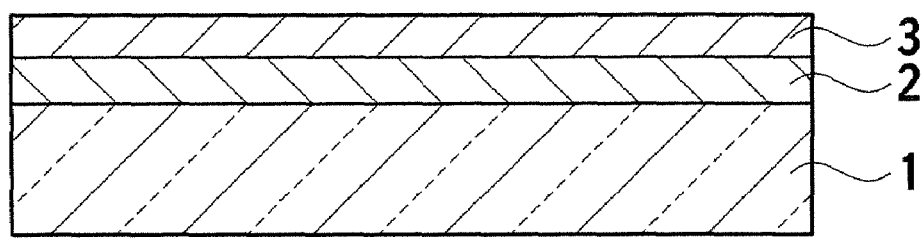
FIG. 1 is a cross section of a liquid crystal display device (an electronic device) in a first manufacturing process for explaining a method of manufacturing a liquid crystal display device (an electronic device) according to a first embodiment of the present invention.

In the method of manufacturing a liquid crystal display device according to the first embodiment of the present invention, first, a substrate (a first substrate) 1 is prepared (see FIG. 1). A transparent silica glass substrate can be used as the first substrate 1.

Then, a foundation layer 2 is formed over the entire surface of the substrate 1 (see FIG. 1). As the foundation layer 2, a silicon (Si) oxide film formed by the spin-on-glass method (spin coating method) can be practically used or a TEOS film can be used.

As shown in FIG. 1, a first semiconductor thin film (a semiconductor thin film in the first layer) 3 is formed over the entire surface of the foundation layer 2. In the first embodiment, this first semiconductor thin film 3 is to be used as a source region (a main electrode region), a channel forming region, and a drain region (a main electrode region) of a thin film transistor forming the liquid crystal display device. The first semiconductor thin film 3 is a silicon (Si) polycrystalline film obtained by forming a silicon (Si) amorphous film by sputtering, for example, and then applying an excimer laser to the Si amorphous film for recrystallization.

Figure 2:
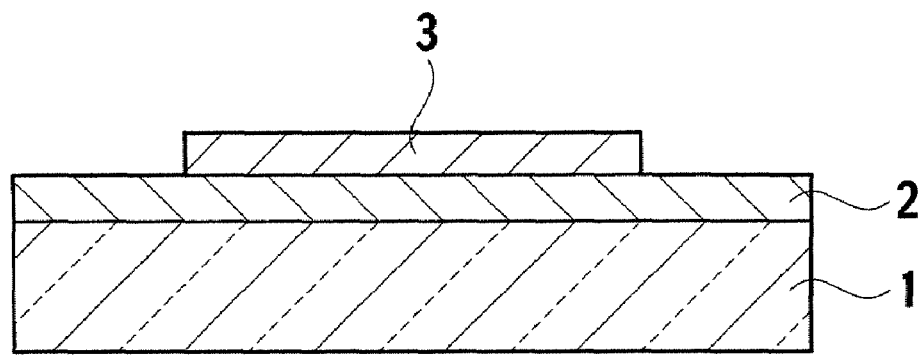
FIG. 2 is a cross section of the liquid crystal display device in a second manufacturing process.

Referring to FIG. 2, the first semiconductor thin film 3 is then patterned such that portions of the first semiconductor thin film 3 other than a portion forming the source region, the channel forming region, and the drain region are removed, by using an etching mask formed by the photolithography to etch the first semiconductor thin film 3.

Figure 3:
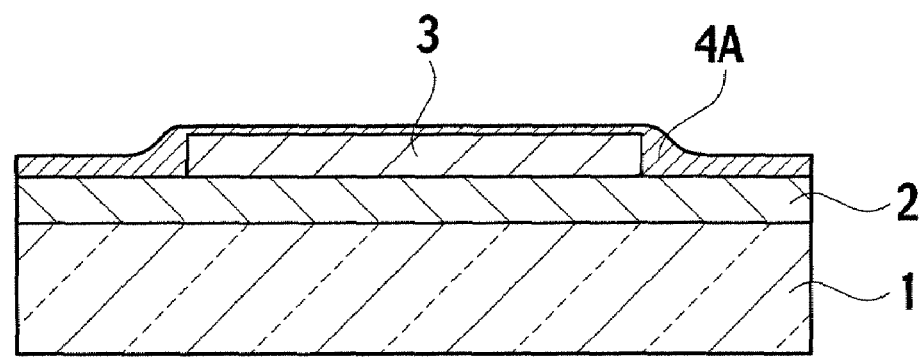
FIG. 3 is a cross section of the liquid crystal display device in a third manufacturing process.
Figure 4:
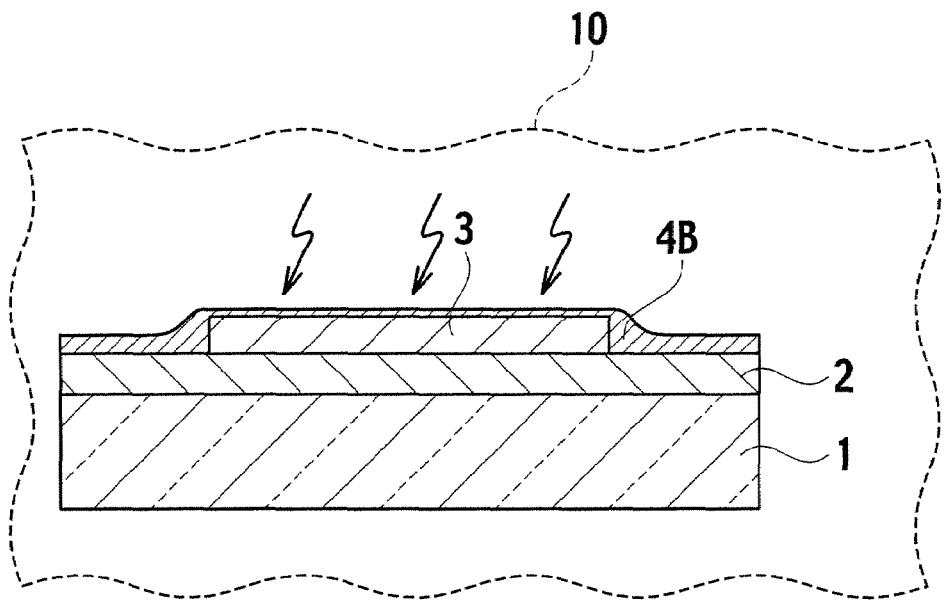
FIG. 4 is a cross section of the liquid crystal display device in a fourth manufacturing process.

Then, as shown in FIG. 3, a first liquid material 4A (a lower layer liquid material) obtained by dissolving polysilazane in an organic solvent is coated using the spin-on-glass method over the entire surface of the substrate 1 so as to cover the first semiconductor film 3. The first liquid material 4A is then dried. As polysilazane of the first liquid material 4A, polyperhydrosilazane expressed by a structure formula —$[SiH_2NH]_n$— (wherein n represents a natural number) can be practically used. Further, polysilazane can be one which is expressed by a structure formula —$[SiR1R2-NR3]_m$— (wherein m represents a natural number) with side chain R1, R2 or R3 having —$CH_3$, —$CH=CH_2$, or —$OCH_3$ can be used.

As the organic solvent, aromatic compounds or aliphatic compounds, more specifically, benzene, toluene, xylene, diethyl ether, dibutyl ether, or the like can be practically used. On the contrary, water or alcohols are not desirable as the organic solvent due to their reaction. Also, water in which ketone and esters are dissolved is not desirable for the organic solvent.

The first liquid material 4A is formed as a portion of a silicon (Si) oxide film on the lower layer side of a gate insulating film of a thin film transistor. The thickness of the first liquid material 4A is set in the order of several tens nm such that hydrogen (H) or oxygen (O) can be reliably supplied to the dangling bond of silicon (Si) in the first liquid material 4A and such that the surface of the first semiconductor thin film 3 which is a base layer of the first liquid material is not physically damaged.

Then, the substrate 1 is transported within a vacuum chamber 4, where $H_2$ gas or $O_2$ gas is supplied and also plasma is generated (a plasma treatment is performed), so that the first liquid material 4A is modified into a first liquid material 4B in which the number of dangling bonds of Si is decreased. Here, rare gas such as argon (Ar) gas, helium (He) gas, or the like can be supplied into the vacuum chamber 4 for use as diluent gas. When $H_2$ gas is supplied to thereby generate $H_2$ plasma, the dangling bonds of Si can be hydrogen-terminated. This terminated hydrogen (H) can be easily converted into oxygen (O) finally. On the other hand, when $O_2$ gas is supplied to thereby generate $O_2$ plasma, conversion of Si—H bonding group or Si—N bonding group into Si—O bonding group can be accelerated. In other words, with this plasma treatment, hydrogen (H) which can be converted easily or oxygen (O) which can be used as it is supplied to the dangling bonds of Si in the first liquid material 4A to thereby decrease the dangling bonds.

Figure 5:
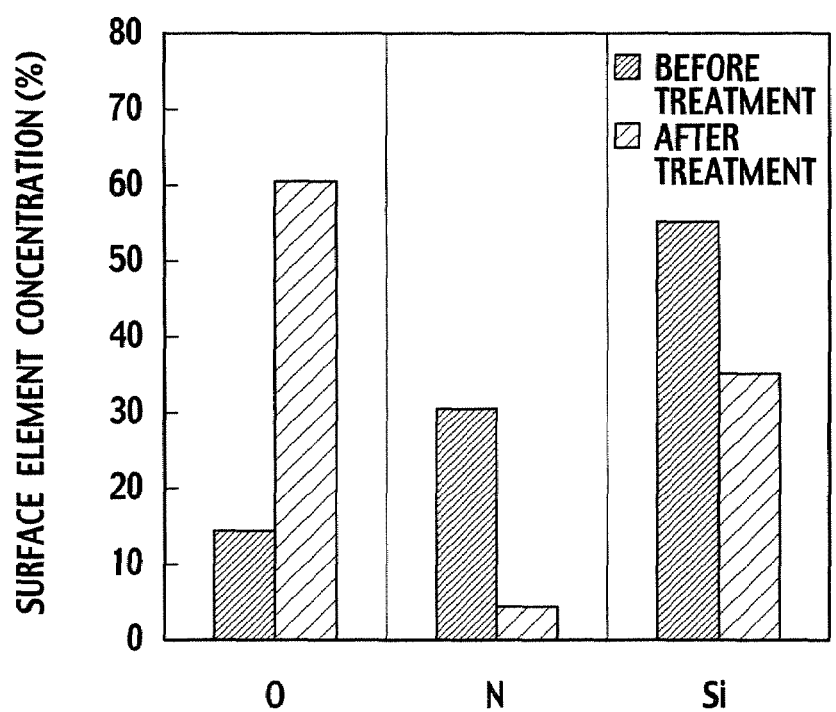
FIG. 5 is a graph showing surface element concentrations of a liquid material before and after the plasma treatment in the manufacturing method according to the first embodiment.

The relationship between the concentration of elements on the surface of the first liquid material 4A prior to the plasma treatment and the concentration of elements on the surface of the first liquid material 4B after the plasma treatment are shown in FIGS. 5 and 6, by a graph and numerical values, respectively. As shown in FIGS. 5 and 6, the concentrations of oxygen (O), nitrogen (N), and Silicon (Si) measured by X-ray photoelectron spectroscopy (XPS) prior to the plasma treatment were 14.27%, 30.44%, and 55.28%, respectively, whereas the concentrations of O, N, and Si after the plasma treatment were 60.74%, 4.13%, and 35.12%, respectively. FIG. 7 shows the concentrations of O and N with respect to the concentration of Si before and after the plasma treatment. From the result that the concentration of oxygen (O) significantly increases and the concentration of N significantly decreases after the plasma treatment, it can be understood that the Si—N bonding groups and the N—H bonding groups of polysilazane are decreased while conversion of the Si—O bonding groups is accelerated. Further, as the Si concentration significantly decreases after the plasma treatment, a significant number of dangling bonds are decreased.

In the present invention, the treatment is not limited to the plasma treatment described above, and a wet treatment using a hydrogen peroxide solution may also be used to achieve the similar process.

Figure 8:
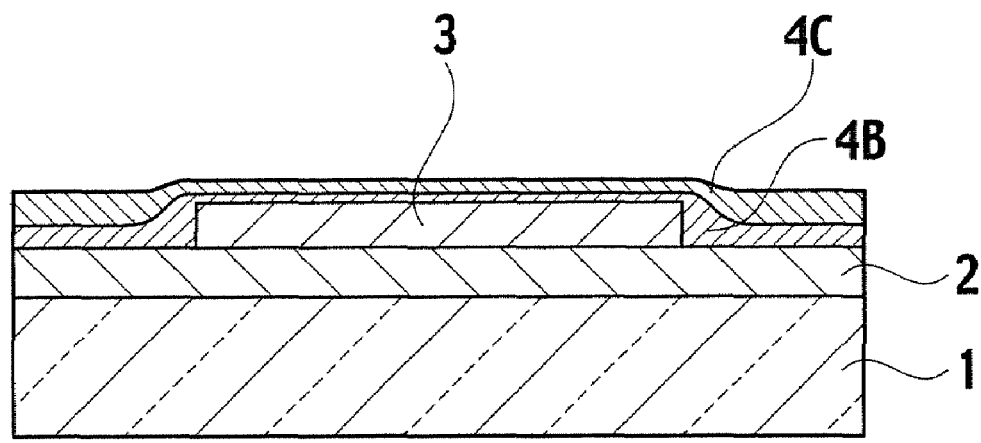
FIG. 8 is a cross section of the liquid crystal display device in a fifth manufacturing process.

Referring now to FIG. 8, a second liquid material 4C (an upper layer liquid material) which is similar to the first liquid material 4A is coated over the entire surface of the first liquid material 4B using a spin-on-glass method, and is then dried. The second liquid material 4C is coated at such a thickness that allows a total thickness of the first liquid material 4B and the second liquid material 4C to be an appropriate thickness as the gate insulating film. For example, the total thickness of the first liquid material 4B and the second liquid material 4C can be set within a range between 100 nm to 2000 nm by coating each liquid material at a thickness of 50 nm to 1000 nm, namely by performing the coating operations twice.

Figure 9:
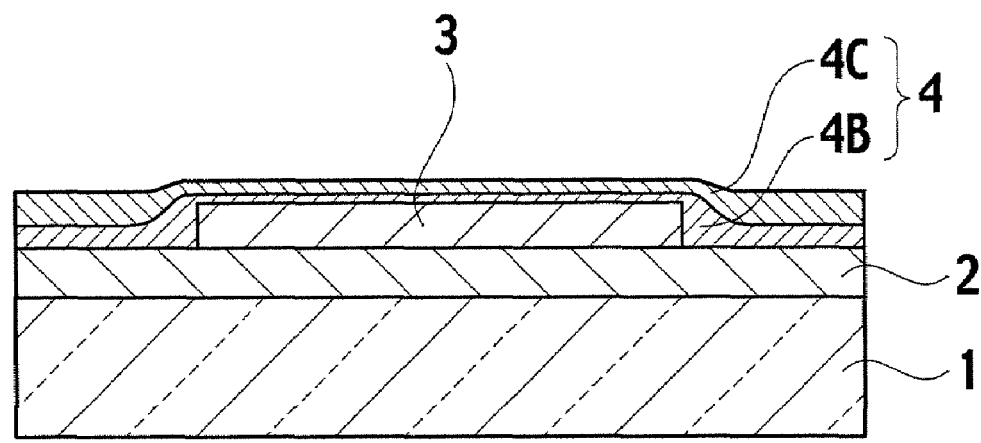
FIG. 9 is a cross section of the liquid crystal display device in a sixth manufacturing process.

Then, a thermal treatment is performed in a gas atmosphere of $H_2O$, $O_2$, or the like, in a temperature range between 200° C. and 500° C. for converting the first liquid material 4B and the second liquid material 4C into a silicon (Si) insulating film, i.e. a silicon (Si) oxide film, thereby forming a gate insulating film 4 of the thin film transistor, as shown in FIG. 9. In the first embodiment, in which a silica glass substrate is used as the substrate 1, the upper limit of the temperature for the thermal treatment is set so as to prevent the thermal effects onto the silica glass substrate. With this thermal treatment, the Si oxide film which has been converted from the first liquid material 4B which is in contact with the surface of the first semiconductor film 3 has a good quality because oxygen has been already bonded to the dangling bonds of Si or reliable conversion from H to O can be achieved in the Si oxide film.

Figure 10:
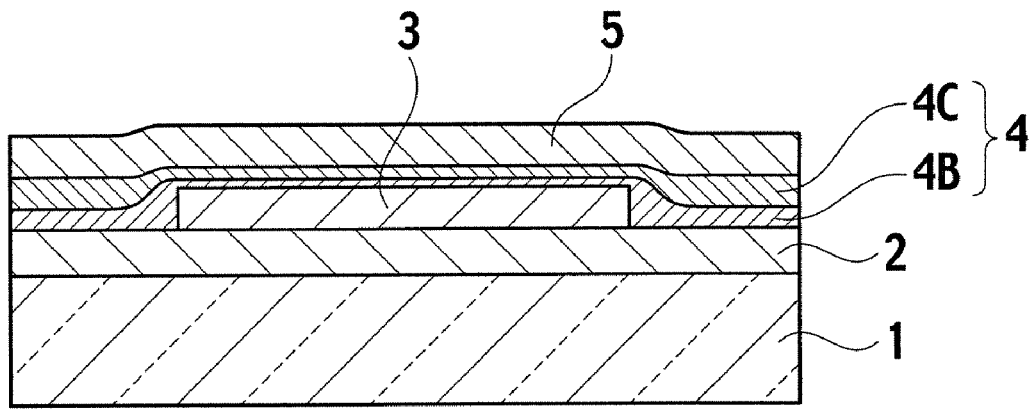
FIG. 10 is a cross section of the liquid crystal display device in a seventh manufacturing process.

Referring to FIG. 10, a second semiconductor film 5 to be used as a gate electrode is then formed over the entire surface of the gate insulating film 4. As the second conductor film 5, an Si polycrystalline film obtained by first forming an Si amorphous film using a sputtering method or a CVD method and then recrystallizing the Si amorphous film can be used. Further, a thin film including compounds formed by Si and a refractory metal, a refractory metal thin film, a metal thin film, or the like may be used in place of the first semiconductor thin film 5.

Figure 11:
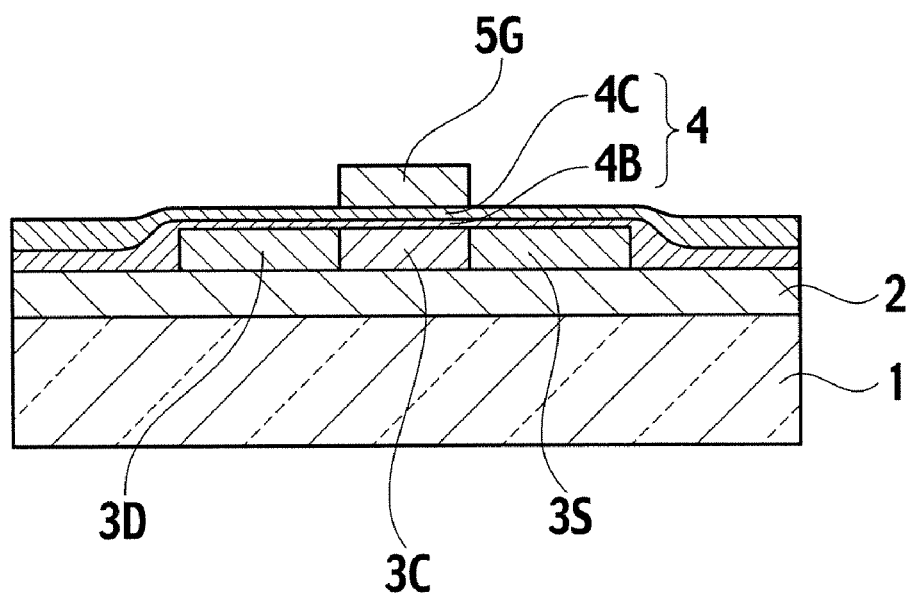
FIG. 11 is a cross section of the liquid crystal display device in an eighth manufacturing process.

Then, the second semiconductor film 5 is patterned using photolithography technique and etching technique to form a gate electrode 5G (and the vertical scanning line) from the second semiconductor film 5 (see FIG. 11). Subsequently, n-type impurities, for example, are doped, using an ion implantation method, into the first semiconductor film 3, to thereby form a source region 3S, a channel forming region 3C, and a drain region 3D in the first semiconductor film 3, as shown in FIG. 11. With this process, a thin film transistor is completed.

Subsequently, a passivation film 6 covering the thin film transistor is formed, and a pixel electrode 7 connected with the source region 3S of the thin film transistor is formed on the passivation film 6. Further, another passivation film 8 is formed so as to cover the pixel electrode 7 (see FIG. 12).

Figure 12:
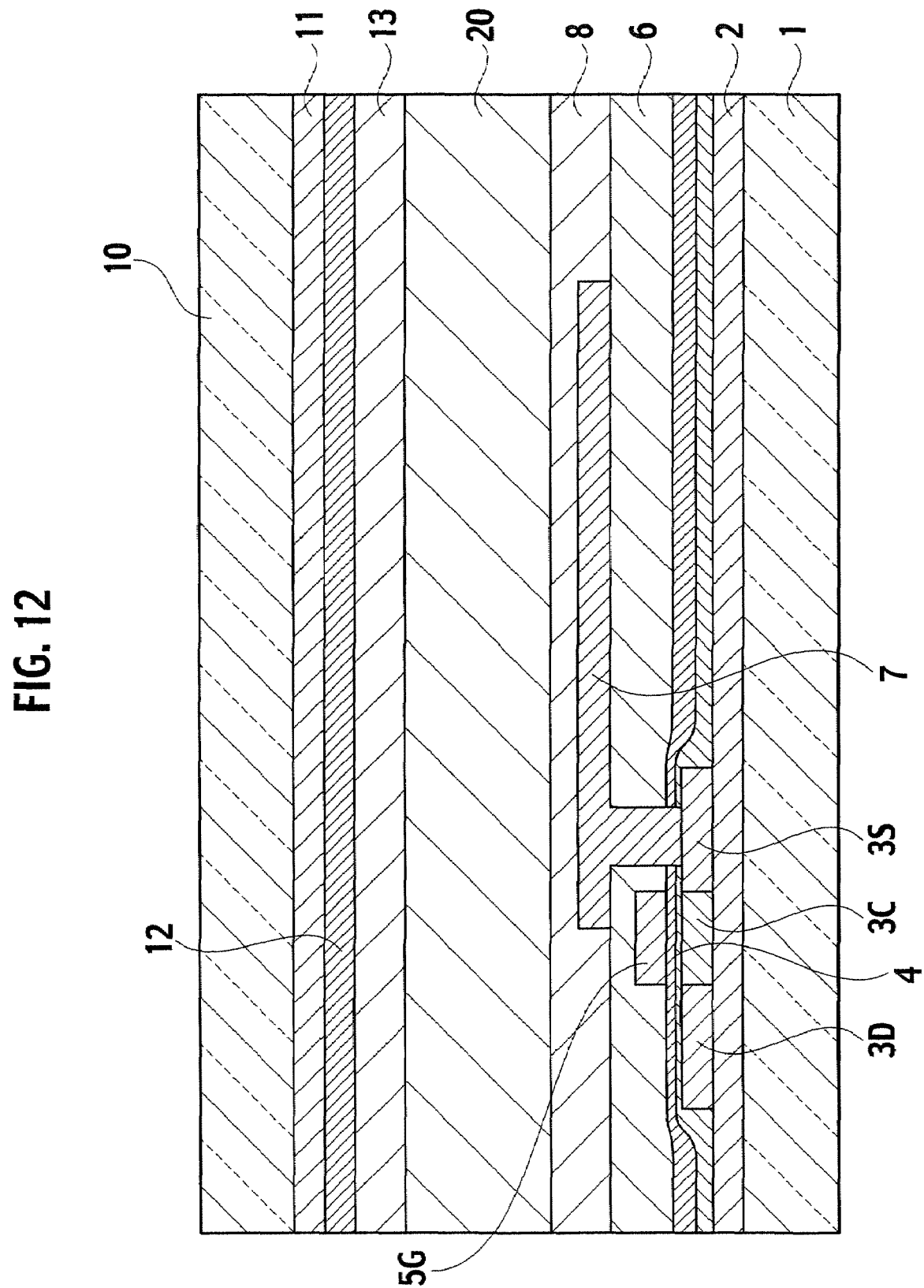
FIG. 12 is a cross section of the liquid crystal display device in a ninth manufacturing process (a cross section of a completed liquid crystal display device)

On the other hand, another substrate (a second substrate) 10 is prepared, and a foundation layer 11, a common electrode 12, and a passivation film 13 are sequentially formed on the substrate 10 (see FIG. 12). Then, as shown in FIG. 12, the substrate 1 and the substrates 10 are disposed so as to be opposed to each other, and liquid crystal 20 is sealed between the respective passivation films 8 and 13, so that a liquid crystal display device according to the first embodiment can be completed.

[Advantage]

According to the first embodiment, after the first liquid material 4A is coated, hydrogen (H) or oxygen (O) is supplied to the dangling bonds of Si in the first liquid material 4A to decrease the dangling bonds, thereby forming the first liquid material 4B. Then, the second liquid material 4C is coated on the first liquid material 4B, and the Si insulating film is formed from the first liquid material 4B and the second liquid material 4C. Accordingly, the quality of the Si insulating film obtained by converting the first liquid material 4B can be enhanced. Consequently, in the thin film transistor, the state of the interface between the channel forming region 3C and the gate insulating film 4 can remain stable, whereby a method of manufacturing a thin film transistor having superior electrical characteristics can be provided.

In addition, in the thin film transistor, a leak current of the gate insulating film 4 can be decreased. As such, a method of manufacturing a liquid crystal display device which is advantageous in high speed display performance and reduced power consumption can be provided.

SECOND EMBODIMENT

In the second embodiment, the present invention is applied to a method of manufacturing trench isolation provided between elements of a semiconductor apparatus (an electronic device).

[Manufacturing Method of Trench Isolation of Semiconductor Integrated Circuit]

Figure 13:
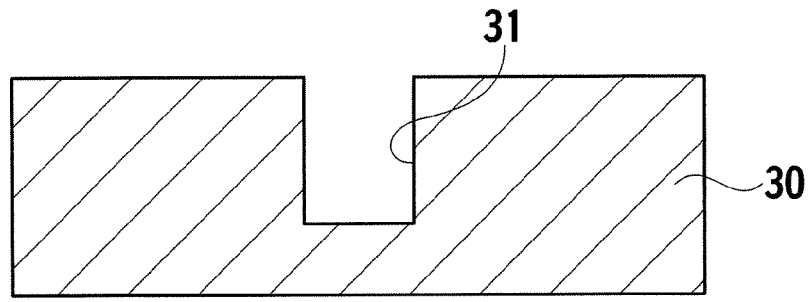
FIG. 13 is cross section of trench isolation in a first manufacturing process step for explaining a method of manufacturing trench isolation of a semiconductor apparatus (an electronic device) according to a second embodiment of the present invention.

First, a substrate 30 is prepared, and a trench 31 is formed in the surface portion of the substrate 30 corresponding to a region between elements in the direction of depth from the surface, as shown in FIG. 13. In the second embodiment, a silicon (Si) single crystal substrate is used for the substrate 30. Alternatively, other substrates, such as an SOI (silicon on insulator) substrate, a compound semiconductor substrate, or the like may also be used as the substrate 30. The trench 31 is formed by anisotropy etching such as RIE (reactive ion etching), using a mask which is formed by photolithography, for example. In the second embodiment, the dimension of the opening of the trench 31 is set to 100 nm×100 nm, for example, with the aspect ratio being set to 4 or greater.

Figure 14:
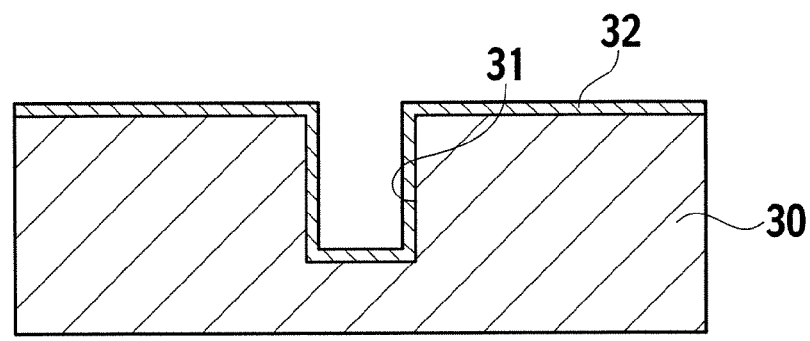
FIG. 14 is a cross section of the trench isolation in a second manufacturing process.

As shown in FIG. 14, a base insulating film 32 is formed over the surface of the substrate 30 including at least the bottom and side walls of the trench 31. A silicon (Si) oxide film formed by thermal oxidation of the substrate surface can be used as the base insulating film 32.

Figure 15:
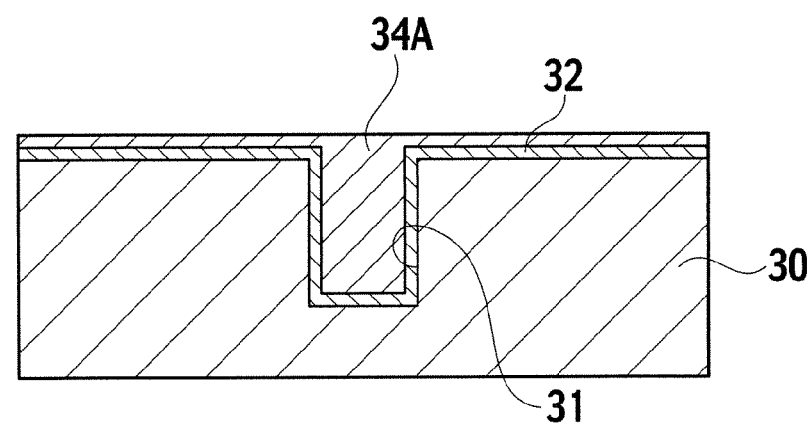
FIG. 15 is a cross section of the trench isolation in a third manufacturing process step.

Then, as shown in FIG. 15, a first liquid material 34A (a lower layer liquid material) obtained by dissolving polysilazane in an organic solvent is coated, using a spin-on-glass method, over the entire surface of the base insulating film 32 along the side walls and the bottom of the trench so as to fill the interior of the trench 31 defined by the side walls and the bottom of the trench 31. The first liquid material 4A which is described above in the first embodiment can be used as the first liquid material 34A. Then, the first liquid material 34A is dried. The first liquid material 34A, due to its flowability, can be reliably buried in the trench which has a small opening and a great depth, and can also facilitate planarization of the buried surface.

Figure 16:
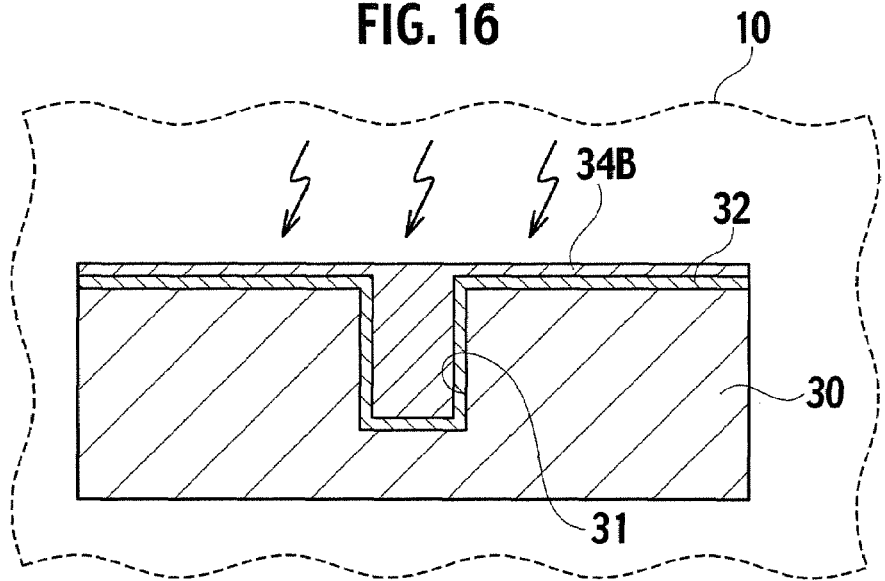
FIG. 16 is a cross section of the trench isolation in a fourth manufacturing process.

Then, as shown in FIG. 16, the substrate 30 is transported within a vacuum chamber 4, in which $H_2$ gas or $O_2$ gas is supplied and also plasma is generated (a plasma treatment is performed), so that the first liquid material 34A is modified into a first liquid material 34B in which the number of dangling bonds of Si is decreased.

Figure 17:
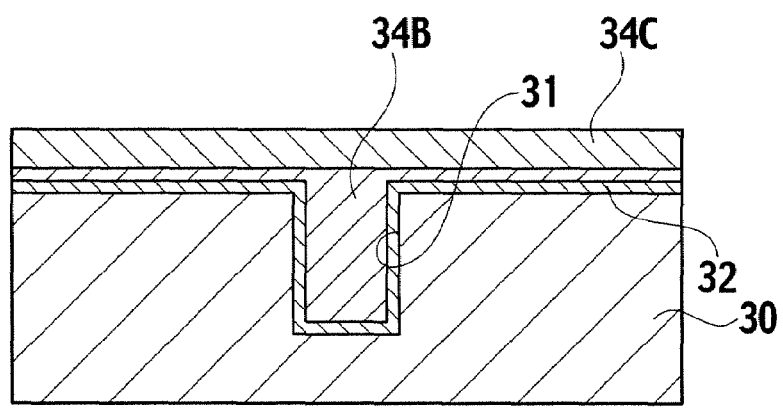
FIG. 17 is a cross section of the trench isolation in a fifth manufacturing process.

Further, as shown in FIG. 17, a second liquid material 34C (an upper layer liquid material) which is similar to the first liquid material 34A is coated over the entire surface of the first liquid material 34B using a spin-on-glass method, and is then dried.

Figure 18:
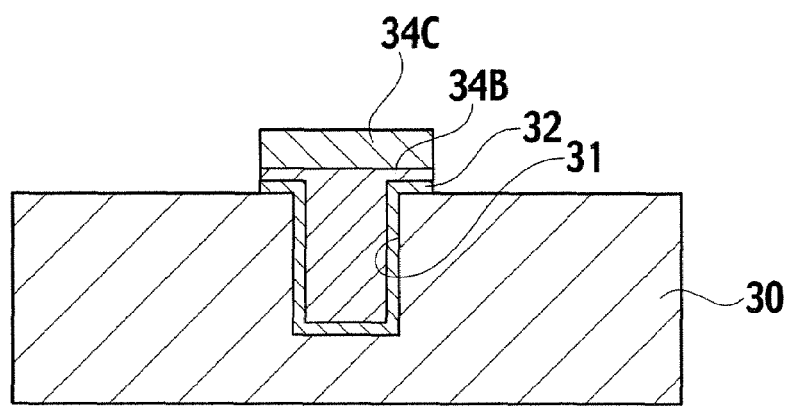
FIG. 18 is a cross section of the trench isolation in a sixth manufacturing process.

Then, a thermal treatment is performed in a gas atmosphere of $H_2O$, $O_2$, or the like, in a temperature range between 200° C. and 900° C. for converting the first liquid material 34B and the second liquid material 34C into a silicon (Si) insulating film, i.e. a silicon (Si) oxide film. In the second embodiment, as a single crystal substrate is used for the substrate 30, the temperature of the thermal treatment can be set to a high temperature. Further, as shown in FIG. 18, the second liquid material 34C and the first liquid material 34B which have been converted into a silicon oxide film, and the base insulating film 32 are patterned, so that trench isolation including the trench 31, the base insulating film 32, the first liquid material 34B and the second liquid material 34C can be completed.

Subsequently, through the various manufacturing processes for manufacturing a transistor, a resistor, a capacitor, a wire, and so on, a semiconductor device according to the second embodiment can be completed.

[Advantage]

According to the second embodiment, after the first liquid material 34A is coated, H or O is supplied to the dangling bonds of Si in the first liquid material 34A to decrease the dangling bonds, thereby forming the first liquid material 34B. Then, the second liquid material 34C is coated on the first liquid material 34B, and the Si insulating film is formed from the first liquid material 34B and the second liquid material 34C. Accordingly, the quality of the Si insulating film obtained by converting the first liquid material 34B can be enhanced. Consequently, a method of manufacturing trench isolation (an electronic device) in which the leak current can be decreased and the dielectric strength can be increased can be provided.

In addition, as the remaining components of polysilazane which is used for the first liquid material 34A is reduced to thereby decrease generation of cracks, it is possible, in this regard, to provide a method of manufacturing trench isolation in which the dielectric strength can be enhanced.

OTHER EMBODIMENTS

Although the invention has been described with respect to some embodiments thereof, it should be understood by those skilled in the art that various other modifications are possible without departing from the scope of the present invention. For example, while in the foregoing embodiments, an example in which the present invention is applied to an electronic device of each of a liquid crystal display device and a semiconductor integrated circuit has been described, the present invention is also applicable to an example in which a liquid material is used for an interlayer insulating film disposed between upper and lower wires in an electronic device including a printed wire circuit.

As described so far, the present invention provides the method of manufacturing an insulating film, the method of manufacturing a transistor, and the method of manufacturing an electronic device, which allow an improvement of the electric characteristics of a silicon (Si) insulating film formed by the spin-on-glass method.

What is claimed is:

1. A method of manufacturing an insulating film, comprising:
    coating a first liquid material, in which polysilazane is dissolved, on a substrate;
    plasma treating the first liquid material to decrease dangling bonds of silicon (Si) in the first liquid material;
    coating a second liquid material, which is similar to the first liquid material, on the first liquid material after said plasma treating; and
    converting a combination of the first liquid material after said plasma treating and the second liquid material into a silicon (Si) insulating film.

2. The method of manufacturing an insulating film of claim 1, wherein each of the first liquid material and the second liquid material comprises a liquid material obtained by dissolving polysilazane in an organic solvent.

3. The method of manufacturing an insulating film of claim 1, wherein the converting comprises applying a thermal treatment to the combination of the first liquid material after said plasma treating and the second liquid material in an atmosphere of $H_2O$ gas or $O_2$ gas.

4. The method of manufacturing an insulating film of claim 2, wherein said plasma treating comprises supplying hydrogen (H) or oxygen (O) to silicon (Si) having dangling bonds.

5. The method of manufacturing an insulating film of claim 2, wherein the liquid material comprises poly - perhydrosilazane complying with a structure formula $-[SiH_2NH]n-$, wherein n represents a natural number, or poly - perhydrosilazane complying with a structure formula $-[SiR1R2-NR3]m-$, wherein m represents a natural number with a side chain R1, R2 or R3 having $—CH_3$, $—CH=CH_2$, or $—OCH_3$, and the organic solvent comprises an aromatic compound or an aliphatic compound.

6. The method of manufacturing an insulating film of claim 2, wherein the converting comprises applying a thermal treatment to the combination of the first liquid material after said plasma treating and the second liquid material in an atmosphere of $H_2O$ gas or $O_2$ gas.

7. The method of manufacturing an insulating film of claim 1, wherein said plasma treating comprises supplying hydrogen (H) or oxygen (O) to silicon (Si) having dangling bonds.

8. The method of manufacturing an insulating film of claim 7, wherein each of the first liquid material and the second liquid material comprises poly - perhydrosilazane complying with a structure formula $-[SiH_2NH]n-$, wherein n represents a natural number, or poly - perhydrosilazane complying with a structure formula $-[SiR1R2-NR3]m-$, wherein m represents a natural number with a side chain R1, R2 or R3 having $—CH_3$, $—CH=CH_2$, or $—OCH_3$, and the organic solvent comprises an aromatic compound or an aliphatic compound.

9. A method of manufacturing a transistor, comprising:
    coating a first liquid material, in which polysilazane is dissolved, over a surface of a first semiconductor thin film on a substrate;
    plasma treating the first liquid material to decrease dangling bonds of silicon (Si) in the first liquid material;
    coating a second liquid material, which is similar to the first liquid material, on the first liquid material after said plasma treating;
    converting a combination of the first liquid material after said plasma treating and the second liquid material into a silicon insulating film to form a gate insulating film; and
    forming a second semiconductor thin film or a metal film on the gate insulating film.

10. The method of manufacturing a transistor of claim 9, wherein each of the first liquid material and the second liquid material comprises a liquid material obtained by dissolving polysilazane in an organic solvent.

11. A method of manufacturing an electronic device, comprising:
    forming a trench in a substrate in a depth direction from a surface of the substrate;

plasma treating the first liquid material to decrease dangling bonds of silicon (Si) in the first liquid material;
coating a second liquid material, which is similar to the first liquid material, on the first liquid material after said plasma treating;
converting a combination of the first liquid material after said plasma treating and the second liquid material into a silicon (Si) insulating film.

12. The method of manufacturing an electronic device of claim 11, wherein each of the first liquid material and the second liquid material comprises a liquid material obtained by dissolving polysilazane in an organic solvent.

* * * * *